United States Patent [19]
Hotta

[11] Patent Number: 5,295,092
[45] Date of Patent: Mar. 15, 1994

[54] SEMICONDUCTOR READ ONLY MEMORY

[75] Inventor: Yasuhiro Hotta, Nara, Japan

[73] Assignee: Sharp Kabushiki Kaisha, Osaka, Japan

[21] Appl. No.: 7,197

[22] Filed: Jan. 21, 1993

[30] Foreign Application Priority Data

Jan. 21, 1992 [JP] Japan .................................. 4-8743

[51] Int. Cl.⁵ .................... G11C 13/00; G11C 11/40
[52] U.S. Cl. .................... 365/51; 365/104; 365/182
[58] Field of Search .............. 365/51, 182, 94, 104

[56] References Cited

U.S. PATENT DOCUMENTS 5,031,139  7/1991  Sinclair ..................... 365/189.01

FOREIGN PATENT DOCUMENTS 3-179775  8/1991  Japan .

OTHER PUBLICATIONS

Ser. No. 07/781,630 to Yasuhiro Hotta dated Oct. 22, 1991.
Okada, M., et al., "16Mb ROM Design Using Bank Select Architecture", *1988 Symposium On VLSI Circuits, Digest of Technical Papers,* Aug. 22-25, 1988, Tokyo, pp. 85-86.

*Primary Examiner*—Terrell W. Fears
*Attorney, Agent, or Firm*—Morrison & Foerster

[57] ABSTRACT

A semiconductor read only memory of this invention includes a plurality of word lines disposed in parallel. The read only memory has a plurality of units. Each of the plurality of units includes: a first bit line which crosses the word lines; a plurality of first virtual ground lines disposed substantially in parallel with the first bit line, each of the plurality of first virtual ground lines having a first end and a second end; a plurality of second virtual ground lines corresponding to the plurality of first virtual ground line, each of the plurality of second virtual ground lines having a first end and a second end; second bit lines, each provided between two adjacent ones of the plurality of second virtual ground lines, each of the second bit lines having a first end and a second end; memory cell columns, each constituted by a plurality of memory cells connected in parallel between one of the second virtual ground lines and one of the second bit lines adjacent thereto; and bank select switching elements for selecting one of the memory cell columns. In the read only memory, the second ends of the plurality of first virtual ground lines are respectively connected to the second ends of the second virtual ground lines, and the first ends of the second bit lines are respectively connected to the bank select switching elements.

3 Claims, 6 Drawing Sheets

SEMICONDUCTOR READ ONLY MEMORY

BACKGROUND OF THE INVENTION

1. Field of the Invention

The present invention relates to a semiconductor read only memory, and more particularly to a semiconductor read only memory in which MOSFETs constituting memory cells are connected in parallel.

2. Description of the Related Art

FIG. 4 shows an equivalent circuit of a semiconductor read only memory (hereinafter, sometimes referred to simply as "a ROM") which is conventionally and widely used. This ROM is a lateral ROM constructed in such a manner that memory cells 3 of MOSFETs are connected in parallel with respect to a plurality of bit lines 2 which cross word lines 1. Conventionally, each of the bit lines 2 is made of metal (hereinafter, referred to as a metal bit line). Alternatively, a diffused layer may function as a bit line (hereinafter, referred to as a diffusion bit line).

In order to dispose memory cells more densely, a hierarchical system (hereinafter, referred to as a hierarchical bit line system) has been proposed (Japanese Patent Application No. 63-75300), as is shown in FIG. 5. In the system, main bit lines $Mb_l$, $Mb_{l+1}$, ..., etc. and sub-bit lines $Sbm_{2l}$, $Sbm_{2l+1}$, ..., etc. are hierarchically provided In the hierarchical bit line system, each of the memory cells $Mm_{21,n}$ is connected between two adjacent sub-bit lines $Sbm_{2l}$ and $Sbm_{2l-1}$. The plurality of memory cells $Mm_{2l,k}$ ($1 \leq k \leq n$) of each row are connected to a common word line $WL_k$. The memory cells $Mm_{21,n}$ are alternately assigned into two groups of odd-numbered banks such as $Bm_{2l-1}$ and even-numbered banks such as $Bm_{2l}$. For the selection of these banks, bank select MOSFETs $Q0_{m,2l}$, $QE_{m,2l}$, ..., etc. are provided on both ends of the sub-bit lines, respectively. Bank select lines $B0_m$ and $BE_m$ are connected to these bank select MOSFETs, respectively. The main bit lines $Mb_l$, $Mb_{l+1}$, ..., etc. are connected to sense amplifiers such as $SA_l$, or connected to GND via MOSFETs such as $Q_{l+1}$.

In the ROM with the hierarchical bit line system, the wired pitch of the main bit lines can be made double as compared with the conventional lateral ROM shown in FIG. 4. The ROM with the hierarchical bit line system can advantageously reduce the parasitic capacitance on bit lines, and especially when the diffusion bit lines are used, the wiring resistance on bit lines can be greatly reduced However, when the diffusion bit lines are used in the hierarchical bit line system shown in FIG. 5, there arises a problem in that the diffusion resistance greatly varies depending on the position of a memory cell in a bank, which is described below, so that the value of discharge current for the read of information greatly varies depending on the position of the memory cell.

There is another problem in that since the value of the diffusion resistance is large and hence the value of the discharge current is small, such a ROM is not suitable for a high-speed read operation.

For example, a case where information is read out from a memory cell $Mm_{2l-1,1}$ by setting the bank select line $B0_m$ High, the other bank select line $BE_m$ Low, and the word line $WL_1$ High is considered. In this case, a control signal VG for a transistor $Q_l$ (not shown) connected to the main bit line $Mb_l$ is made Low. A control signal VG for a transistor $Q_{l-1}$ connected to the adjacent main bit line $Mb_{l-1}$ is made High. As a result, the main bit line $Mb_{l-1}$ is connected to the GND. The circuit in the above-mentioned state is shown in FIG. 6. A discharge current i flows through a path formed by the main bit line $Mb_l$, the bank select MOSFET $Q0_{m,2l-1}$, the sub-bit line $Sbm_{2l-1}$ the memory cell $Mm_{2l-1,1}$, the sub-bit line $Sbm_{2l-2}$, a bank select MOSFET $Q0_{m,2l-2}$, and the main bit line $Mb_{l-1}$, in this order. The total value of diffusion resistance of the sub-bit lines $Sbm_{2l-1}$ and $Sbm_{21-2}$ in this path is 2r, where r indicates the diffusion resistance between respective two memory cells. The total diffusion resistance value varies depending on the position of the selected memory cell, and the possible largest value of the total diffusion resistance is 2nr.

As described above, in the ROM shown in FIG. 5, the value of diffusion resistance greatly varies depending on the position of a memory cell from which information is read out. Moreover, the discharge current flows through three transistors, so that the ROM shown in FIG. 5 has a poor discharge ability as compared with a system without bank select MOSFETs (in such a system, the discharge current flows through only one transistor).

SUMMARY OF THE INVENTION

The semiconductor read only memory of this invention includes a plurality of word lines disposed in parallel. The semiconductor read only memory has a plurality of units. Each of the plurality of units includes: a first bit line which crosses the word lines; a plurality of first virtual ground lines disposed substantially in parallel with the first bit line, each of the plurality of first virtual ground lines having a first end and a second end; a plurality of second virtual ground lines corresponding to the plurality of first virtual ground line, each of the plurality of second virtual ground lines having a first end and a second end; second bit lines, each provided between two adjacent ones of the plurality of second virtual ground lines, each of the second bit lines having a first end and a second end; memory cell columns, each constituted by a plurality of memory cells connected in parallel between one of the second virtual ground lines and one of the second bit lines adjacent thereto; and bank select switching elements for selecting one of the memory cell columns, wherein the second ends of the plurality of first virtual ground lines are respectively connected to the second ends of the second virtual ground lines, and the first ends of the second bit lines are respectively connected to the bank select switching elements.

In one embodiment of the present invention, the bank select switching elements may be MOSFETs.

In another embodiment of the present invention, memory cells may be MOSFETs.

Thus, the invention described herein makes possible the advantage of providing a ROM capable of reading at a high speed while provided with memory cells densely disposed.

This and other advantages of the present invention will become apparent to those skilled in the art upon reading and understanding the following detailed description with reference to the accompanying figures.

DESCRIPTION OF THE PREFERRED EMBODIMENTS

Figure 1:
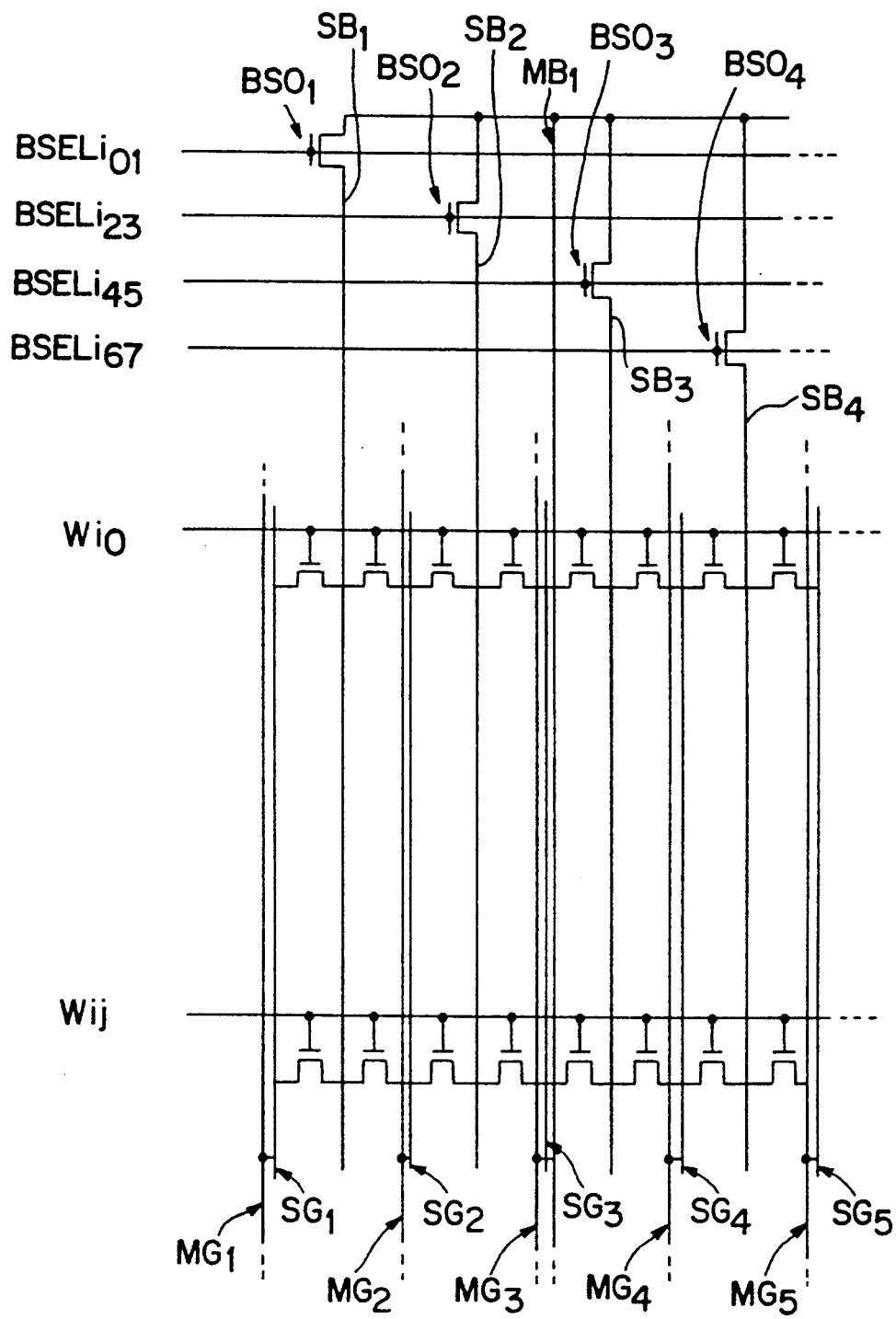
FIG. 1 is a circuit diagram showing part of a ROM in one example of the present invention.
Figure 2:
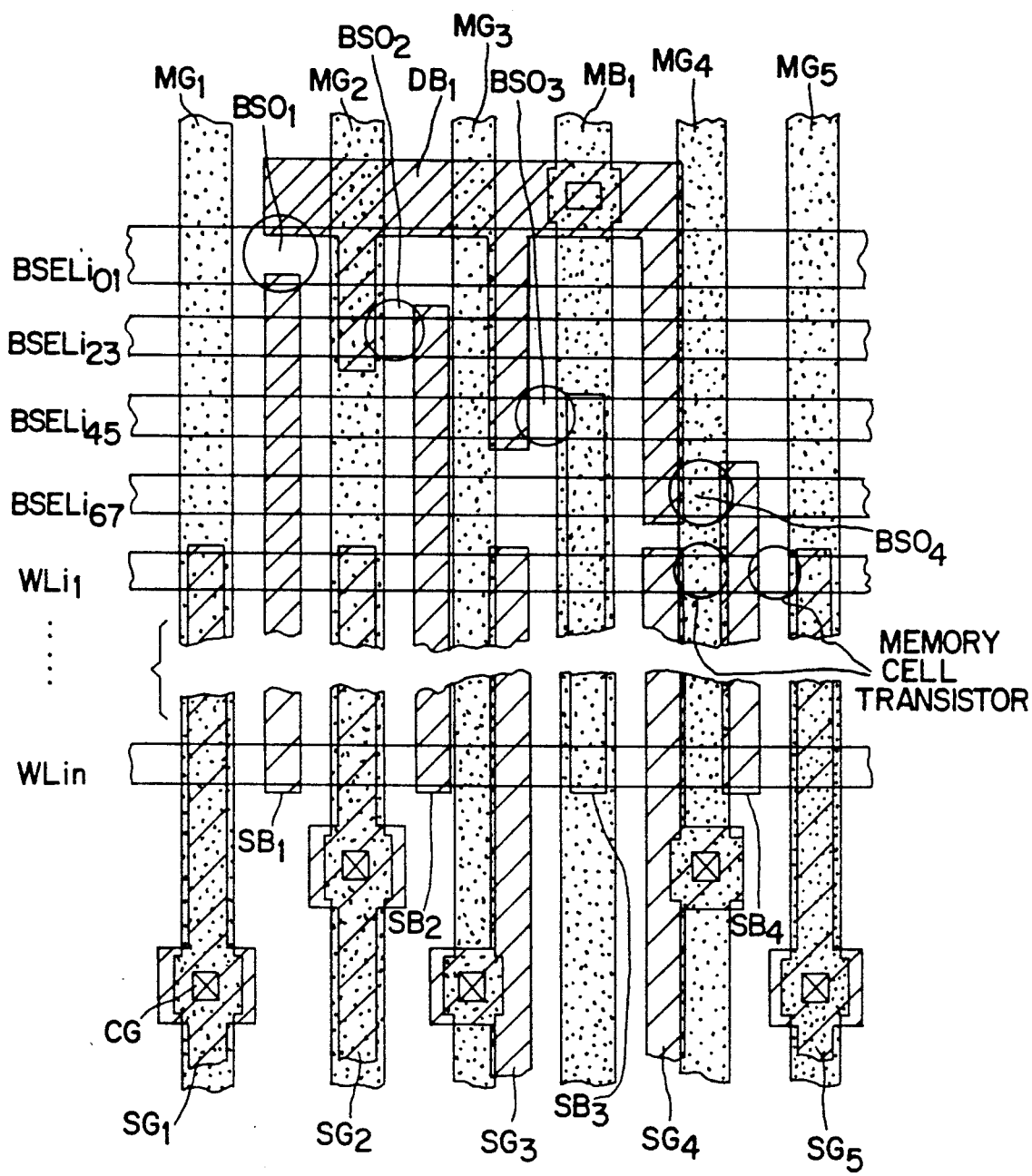
FIG. 2 shows a layout of an example having diffusion bit lines according to the present invention.

FIG. 1 shows part of a ROM in one example of the present invention. FIG. 2 shows a pattern on the surface of a semiconductor substrate in this example. The ROM of this example basically adopts a hierarchical bit line system. The bit lines are constituted by sub-bit lines $SB_1$, $SB_2$, ..., etc., and main bit lines $MB_1$, $MB_2$, ..., etc. Impurity diffused layers (hereinafter, referred to as "diffused layers") formed in a silicon substrate function as the sub-bit lines. Metal (aluminum) interconnections which are disposed on an interlevel insulating film (not shown) formed on the silicon substrate function as the main bit lines. As compared with the resistance of each of the sub-bit lines $SB_1$, $SB_2$, ..., etc., the resistance of each of the main bit lines $MB_1$, $MB_2$, ..., etc. can be substantially disregarded. The main bit lines $MB_1$, $MB_2$, ..., etc. are connected to sense amplifiers (not shown in FIGS. 1 and 2), respectively.

To each of the main bit lines (e.g., $MB_1$), four sub-bit lines (e.g., $SB_1$, $SB_2$, $SB_3$, and $SB_4$) are connected at one of their ends, respectively, via switching elements described below. Virtual sub-ground lines $SG_1$, $SG_2$, ..., etc. of diffused layers are arranged in an alternate manner with the sub-bit lines $SB_1$, $SB_2$, ..., etc. Virtual main ground lines $MG_1$, $MG_2$, ..., etc. with metal (aluminum) interconnections are provided on the interlevel insulating film (not shown) The virtual sub-ground lines $SG_1$, $SG_2$, ..., etc. are directly connected to the virtual main ground lines $MG_1$, $MG_2$, ..., etc., respectively, via contact holes CG (FIG. 2) formed in the interlevel insulating film.

As is shown in FIG. 2, the memory cells used in this example are MOSFETs (memory cell transistors). Portions of the diffused layers functioning as the sub-bit lines $SB_1$, $SB_2$, ..., etc. and the virtual sub-ground lines $SG_1$, $SG_2$, ..., etc. also function as source/drain regions of the memory cell transistors. More specifically, portions of the sub-bit lines $SB_1$, $SB_2$, ..., etc. also function as the drain regions of the memory cell transistors. Portions of the virtual sub-ground lines $SG_1$, $SG_2$, ..., etc. also function as the source regions of the memory cell transistors. The word lines $WL_{i1}$-$WL_{in}$ which cross the sub-bit lines $SB_1$, $SB_2$, ..., etc. and the virtual sub-ground lines $SG_1$, $SG_2$, ..., etc. are used as the gate electrodes of the memory cell transistors. For example, the gate electrodes of a plurality of memory cells which belong to a row k ($1 \leq k \leq n$) are part of the common word line $WL_{ik}$.

On one side of the sub-bit lines $SB_1$, $SB_2$, $SB_3$, and $SB_4$, bank select MOSFETs $BS0_1$, $BS0_2$, $BS0_3$, and $BS0_4$ are connected thereto, respectively. More specifically, as is shown in FIG. 2, in each of the bank select MOSFETs $BS0_1$, $BS0_2$, $BS0_3$, and $BS0_4$, one end of the corresponding one of the sub-bit lines $SB_1$, $SB_2$, $SB_3$, and $SB_4$ functions as one of the source and drain regions thereof, and a diffused region $DB_1$ where the sub-bit lines $SB_1$, $SB_2$, $SB_3$, and $SB_4$ are connected to the main bit line $MB_1$ functions as the other one of the source and drain regions thereof. Bank select lines $BSEL_{i01}$, $BSEL_{i23}$, $BSEL_{i45}$, and $BSEL_{i67}$ also function as the gate electrodes of the bank select MOSFETs $BS0_1$, $BS0_2$, $BS0_3$, and $BS0_4$.

On the other side of the sub-bit lines $SB_1$, $SB_2$, $SB_3$, and $SB_4$, no elements such as bank select MOSFETs are provided.

In the ROM having the above-mentioned structure, a case where information is read out from a memory cell $Mm_{2k}$ ($1 \leq k \leq n$) which is connected to the word line $WL_{ik}$, the sub-bit line $SB_2$, and the virtual sub-ground line $SG_2$ is considered. In this case, the bank select line $BSEL_{i23}$ is set High, and the other bank select lines $BSEL_{i01}$, $BSEL_{i45}$, and $BSEL_{i67}$ are set Low. The word line $WL_{ik}$ which is connected to the memory cell $Mm_{2k}$ to be selected is set High, and the virtual sub-ground line $SG_2$ which is connected to the source region of the MOSFET of the memory cell $Mm_{2k}$ is connected to the ground.

Figure 3:
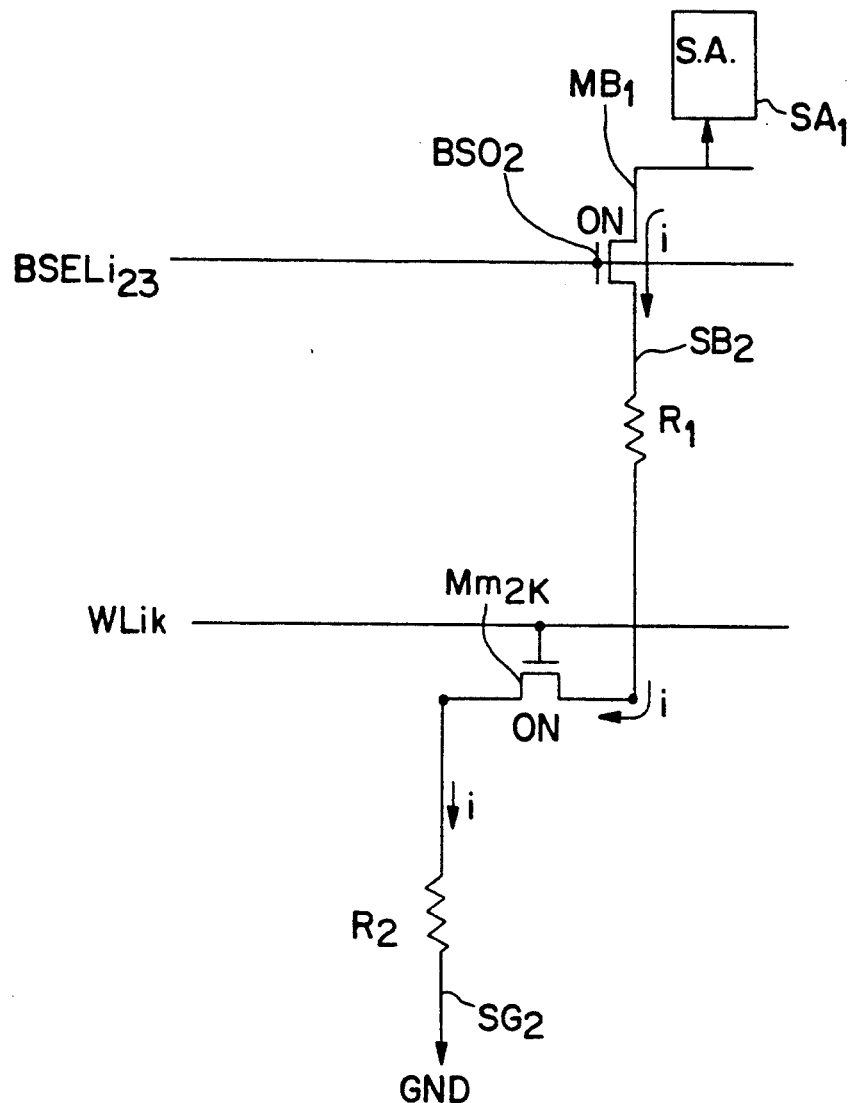
FIG. 3 is a circuit diagram schematically showing the current flow when information is read out from a memory cell in the example according to the present invention.
Figure 4:
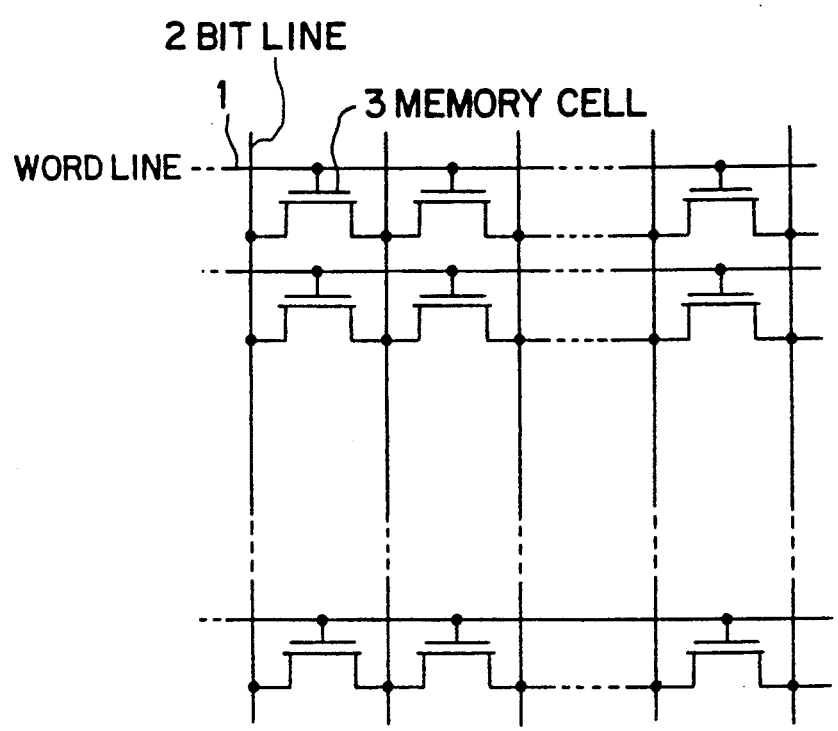
FIG. 4 is a circuit diagram showing a prior art ROM.
Figure 5:
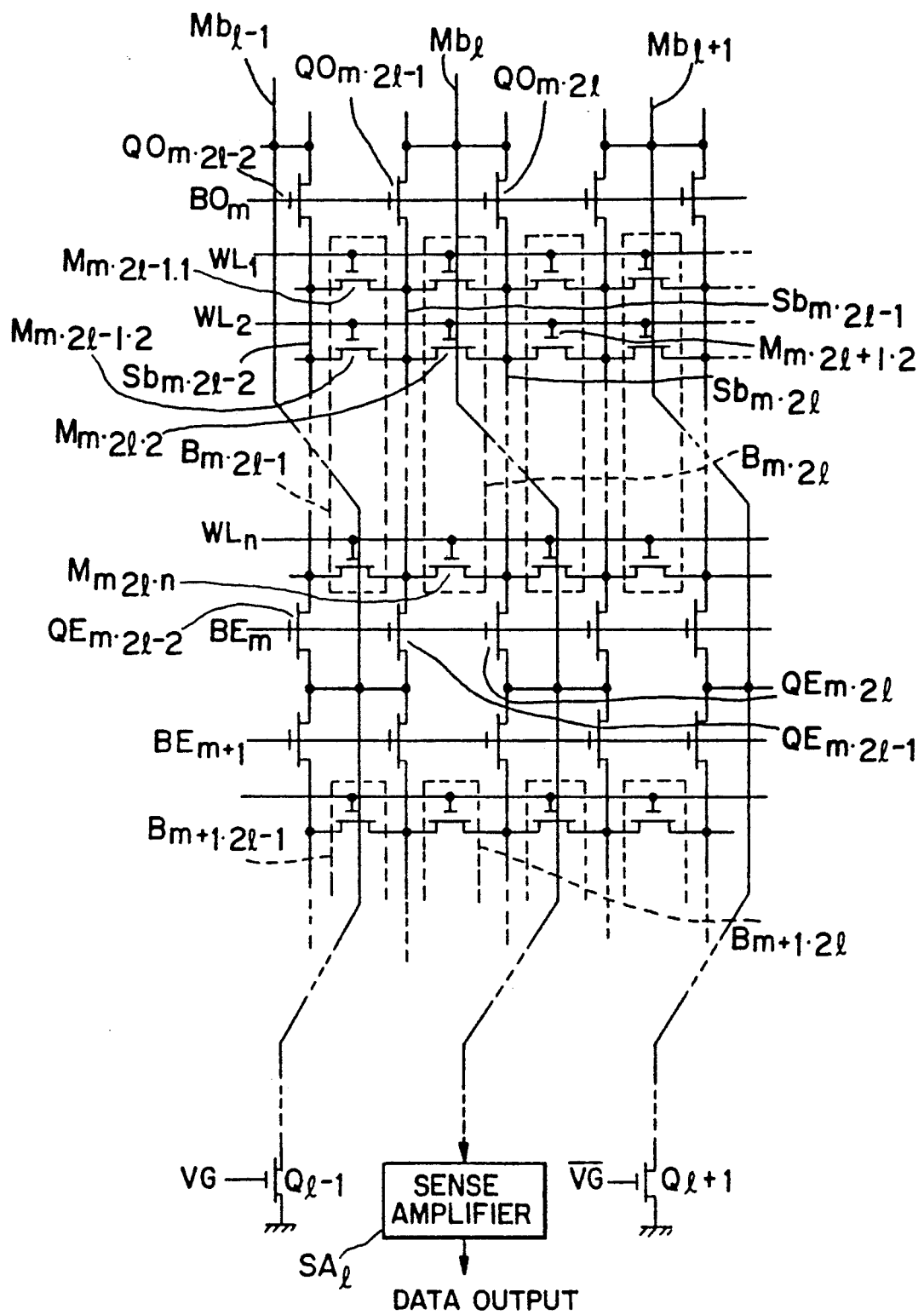
FIG. 5 is a circuit diagram showing a prior art ROM with a hierarchical bit line system.

A discharge current i in this case flows in such a manner as is shown in FIG. 3. The discharge current i flows through a path formed by the main bit line $MB_1$, the bank select MOSFET $BS0_2$, the sub-bit line $SB_2$, the memory cell $Mm_{2k}$, the virtual sub-ground line $SG_2$, and the virtual main ground line $MG_2$, in this order. The discharge current i finally reaches the ground. When diffusion resistances of the sub-bit line $SB_2$ and the virtual sub-ground line $SG_2$ are respectively denoted as R1 and R2, the total resistance value in this case is expressed by R1+R2. The diffusion resistances R1 and R2 are represented by kr and (n−k)r, respectively, where r indicates the diffusion resistance between memory cells. Therefore, the total diffusion resistance is a constant of nr, independent of the position of the selected memory cell.

As described above, the total diffusion resistance of the sub-bit lines and the virtual subground lines through which the discharge current flows is always constant independent of the position of the memory cell from which information is to be read out. Accordingly, if the position of the selected memory cell is changed, the value of the discharge current i is always constant.

In order to perform a stable read operation at a high speed, a difference in discharge current value between two binary states of the selected memory cell should be made larger. Specifically, in a 0 state, the selected memory cell is in an on state. In a 1 state, the selected memory cell is in an off state, i.e., in a normally off state. Accordingly, it becomes possible to operate stably at a high speed by increasing the value of the discharge current in the 0 state.

Figure 6:
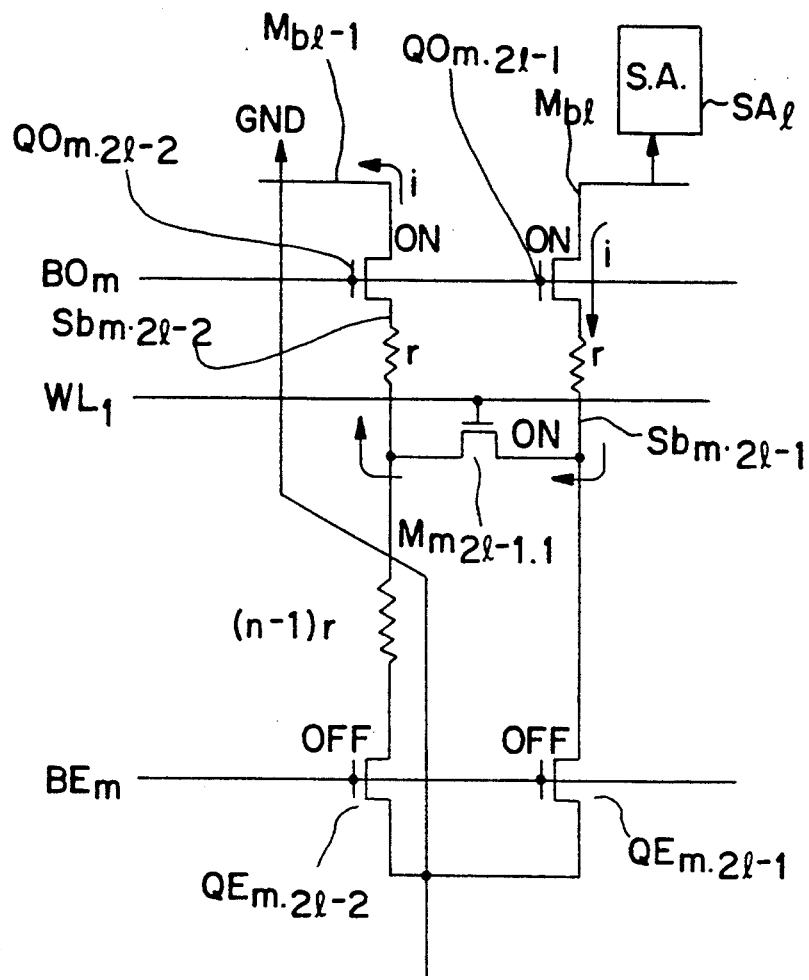
FIG. 6 is a circuit diagram schematically showing the current flow when information is read out from a memory cell in the prior art ROM shown in Figure 5.

In the conventional ROM with the hierarchical bit line system, as is shown in FIG. 6, the value of the discharge current is determined by the conductive resistance of the selected memory cell, the conductive resistances of the two bank select MOSFETs $QO_{m,2l-2}$ and $QO_{m,2l-1}$, and the diffusion resistances of the sub-bit lines $Sb_{m2l-1}$ and $Sbm_{2l-2}$ (as described above, since the largest diffusion resistance value of each sub-bit line is nr, the total diffusion resistance of the subbit lines becomes 2nr).

On the other hand, in the ROM of this example, the value of the discharge current i is determined by the conductive resistance of the selected memory cell, the conductive resistance of the single bank select MOSFET BS0$_2$, and the diffusion resistances of the sub-bit line SB$_2$ and the virtual sub-ground line SG$_2$ (the total diffusion resistance of R1+R2 corresponds to nr). The total diffusion resistance of the sub-bit line SB$_2$ and the virtual sub-ground line SG$_2$ can be nr which is half of the largest value 2nr of the total diffusion resistance in the conventional ROM with the hierarchical bit line system. As a result, the value of the discharge current i can be made larger.

Since the discharge current i flows through only two transistors (i.e., the bank select MOSFET and the memory cell), the total conductive resistance can be reduced by a conductive resistance of one bank select MOSFET as compared with the conventional ROM with a hierarchical bit line system. As a result, the value of the discharge current can be made much larger, and a high-speed read can be realized. Moreover, as the result that the discharge current becomes larger and the S/N ratio becomes larger, the operation margin can be broader, thereby attaining a stable operation.

In the above example, the case of the mask ROM is described. Alternatively, the present invention can be applied to another type of semiconductor read only memory in which a plurality of memory cells are arranged in a matrix, such as an EPROM, or an E$^2$PROM.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor read only memory including a plurality of word lines disposed in parallel, said read only memory having a plurality of units, each of said plurality of units comprising:
   a first bit line which crosses said word lines;
   a plurality of first virtual ground lines disposed substantially in parallel with said first bit line, each of said plurality of first virtual ground lines having a first end and a second end;
   a plurality of second virtual ground lines corresponding to said plurality of first virtual ground line, each of said plurality of second virtual ground lines having a first end and a second end;
   second bit lines, each provided between two adjacent ones of said plurality of second virtual ground lines, each of said second bit lines having a first end and a second end;
   memory cell columns, each constituted by a plurality of memory cells connected in parallel between one of said second virtual ground lines and one of said second bit lines adjacent thereto; and
   bank select switching elements for selecting one of said memory cell columns,
   wherein said second ends of said plurality of first virtual ground lines are respectively connected to said second ends of said second virtual ground lines, and said first ends of said second bit lines are respectively connected to said bank select switching elements.

2. A semiconductor read only memory according to claim 1, wherein said bank select switching elements are MOSFETs.

3. A semiconductor read only memory according to claim 1, wherein said memory cells are MOSFETs.

* * * * *